United States Patent
Taguchi et al.

(10) Patent No.: US 6,492,612 B1
(45) Date of Patent: Dec. 10, 2002

(54) PLASMA APPARATUS AND LOWER ELECTRODE THEREOF

(75) Inventors: Chihiro Taguchi, Kofu; Ryo Nonaka, Nakakoma-gun, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/868,645
(22) PCT Filed: Dec. 21, 1999
(86) PCT No.: PCT/JP99/07182
§ 371 (c)(1), (2), (4) Date: Jun. 28, 2001
(87) PCT Pub. No.: WO00/41229
PCT Pub. Date: Jul. 13, 2000

(30) Foreign Application Priority Data

Dec. 28, 1998 (JP) .......................................... 10-372027

(51) Int. Cl.$^7$ .............................................. B23K 10/00
(52) U.S. Cl. ............................ 219/121.43; 219/121.54; 219/121.52; 219/121.58; 118/723 I; 156/345
(58) Field of Search ........................ 219/121.4, 121.43, 219/121.52, 121.41, 121.54, 121.58; 156/345; 118/723 I, 723 R; 204/298.21

(56) References Cited

U.S. PATENT DOCUMENTS 5,535,507 A * 7/1996 Barnes et al. ................. 29/825
5,886,866 A * 3/1999 Hausmann ................... 361/234
6,042,686 A * 3/2000 Dible et al. .................. 156/345

FOREIGN PATENT DOCUMENTS

JP 8130100 * 5/1996
JP 9260352 * 10/1997

* cited by examiner

Primary Examiner—Mark Paschall
(74) Attorney, Agent, or Firm—Oblon, Spivak, McClelland, Maier & Neustadt, P.C.

(57) ABSTRACT

The present invention is constituted of a lower electrode structure (1) comprising a base table (2) formed of a conductive material, an electrostatic adsorption member (3) formed on the base table (2) and having a dielectric layer (4) on which the substrate to be mounted and within which an electrode (5) electrically isolated from the base table (2) is housed, first wiring (7) having an end connected to the electrode (3) of the electrostatic adsorption member, a direct-current source (8) connected to the other end of the first wiring (7), second wiring (10) having an end connected to the base table (2), a high frequency source (11) connected to the other end of the second wiring (10), a third wiring (14) for connecting the first wiring (7) and the second wiring (10), and a capacitor (13) formed on the third wiring (14). Plasma processing is performed by disposing the lower electrode structure (1) in the chamber (21).

9 Claims, 3 Drawing Sheets

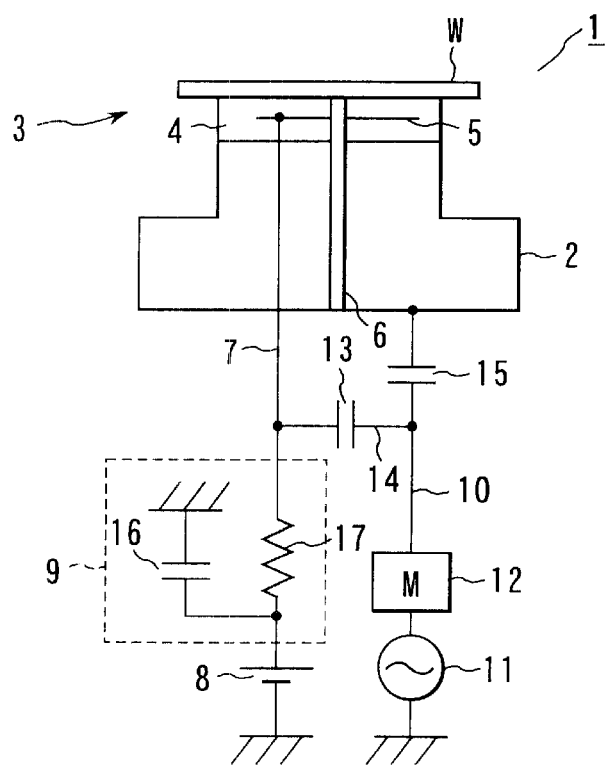
FIG. 1
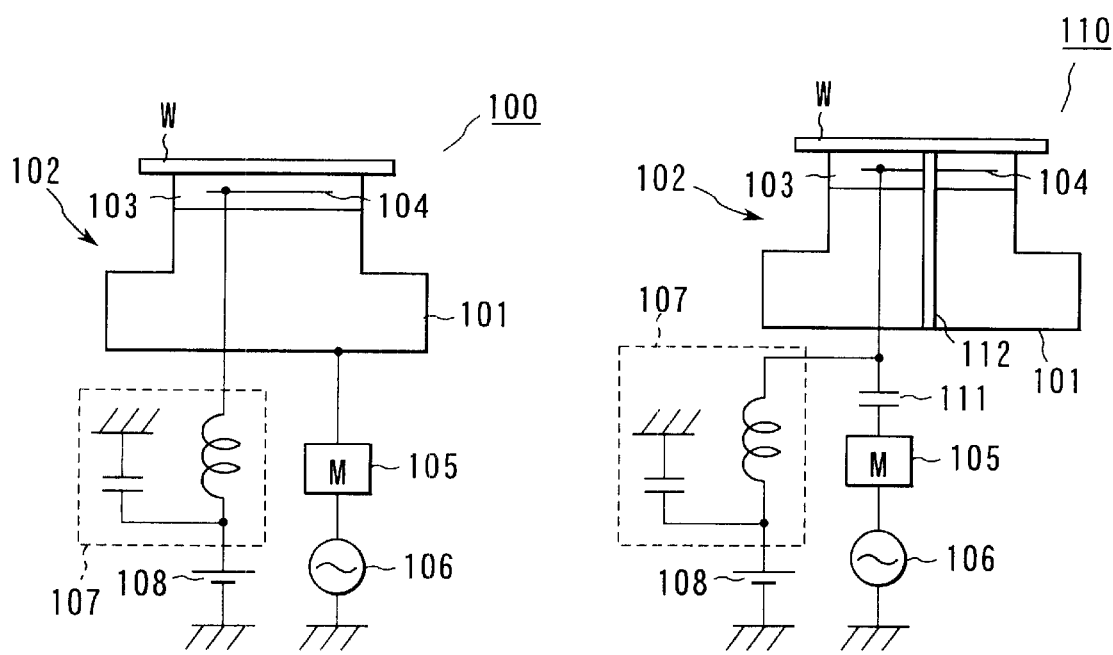
FIG. 4
FIG. 5

PLASMA APPARATUS AND LOWER ELECTRODE THEREOF

TECHNICAL FIELD

The present invention relates to a lower electrode structure used in applying plasma processing, such as etching, to a substrate such as a semiconductor substrate. The present invention also relates to a plasma processing apparatus using the lower electrode structure.

BACKGROUND ART

In a manufacturing process for a semiconductor device etc., processing within a high vacuum, such as a plasma etching, is frequently employed. However, when processing is performed under the high vacuum, vacuum adsorption cannot be used for holding a substrate such as a semiconductor substrate (hereinafter referred to as "wafer") since the vacuum adsorption is usually applicable in the air. For this reason, the wafer is usually held by a mechanical means such as a clamp.

When the wafer is held by the clamp, the distal end of the clamp comes into contact with an edge or a working surface of the wafer. As a result, dust is generated at the time the clamp comes into contact with the wafer and sometimes contaminates the wafer surface.

To overcome these problems, a holding means called an electrostatic chuck has been widely used.

FIG. 4 is a schematic view of a lower electrode structure having the electrostatic chuck.

A lower electrode structure 100 shown in FIG. 4 has a susceptor 101 formed of aluminium and an electrostatic chuck 102 formed thereon.

The electrostatic chuck 102 has a dielectric layer 103 having a mounting surface for mounting a wafer W thereon and a flat electrode 104 arranged in the dielectric layer 103. The susceptor 101 is connected to a high frequency source 106 via a matching box 105. On the other hand, to a flat electrode 104, a direct-current source 108 is connected by way of a low pass filter 107.

In the lower electrode structure 100 having the aforementioned structure, when a high frequency power is supplied from the high frequency source 106 to the susceptor 101; at the same time a direct-current voltage is applied from the direct-current source 108 to the flat electrode 104, electrostatic attraction such as a Coulomb force is produced between the flat electrode 104 and the wafer W mounted on the dielectric layer 103. As a result, the dielectric layer 103 attracts the wafer W and holds it.

When such a lower electrode structure 100 is arranged in a chamber of a plasma processing apparatus such as a plasma etching apparatus, and the chamber is vacuumed, and then, a high frequency power is supplied from the high frequency source 106 to the susceptor 101, a high frequency electric field is formed in the vicinity of a working surface of the wafer W.

Thereafter, when a process gas is introduced into the chamber, a plasma of the process gas is produced due to the high frequency electric field. The plasma is applied to the wafer W to perform plasma etching.

However, if the frequency of the high-frequency power to be supplied from the high frequency source 106 to the susceptor 101 is, for example, 2 MHz or less, the dielectric layer 103 interposed between the wafer W and the susceptor 101 prevents the high frequency from passing through. As a result, the high frequency electric field is rarely converged on the wafer W, decreasing etching characteristics. In particular, when the dielectric layer 103 is formed of ceramic, this tendency is significantly observed.

Different from the lower electrode structure shown in FIG. 4 another type of lower electrode structure shown in FIG. 5 is known.

A lower electrode structure 110 differs from that shown in FIG. 4. A high frequency power 106 is connected to a flat electrode 104 via a matching box 105 and a capacitor 11. The direct-current voltage from the direct-current source 108 is superimposed on the high frequency voltage supplied from the high frequency source 106 and then applied to the flat electrode 104.

According to the lower electrode structure 110 mentioned above, a dielectric layer 103 can pass a high frequency through it, compared with the lower electrode structure 100 shown in FIG. 4, whereby the high frequency electric field can be easily converged on the wafer W.

In the meantime, the heat conductivity under the high vacuum is lower than that under normal pressure, due to the extremely low amount of heat-conductive medium. In the plasma processing performed under the high vacuum, a helium gas pipe 112 for supplying helium gas for heat transmission to a space between the wafer W and the dielectric layer 103 is arranged, as shown in FIG. 5. Due to this, the temperature of the wafer W can be controlled even under the high vacuum.

However, the lower electrode structure shown in FIG. 5 has a problem in that an abnormal discharge occurs within the helium gas pipe 112 when helium gas is supplied.

DISCLOSURE OF INVENTION

An object of the present invention is to provide a lower electrode structure capable of forming a high frequency electric field which capable of applying satisfactory plasma processing on a substrate without an abnormal discharge and to provide a plasma processing apparatus using the lower electrode structure.

To attain the aforementioned object, the present invention provides a lower electrode structure for use in an apparatus for applying plasma processing to a substrate, comprising:

a base table formed of a material having a conductivity;

an electrostatic adsorption member formed on the base table and having a dielectric layer on which the substrate to be mounted and within which an electrode electrically isolated from the base table is housed;

first wiring having an end connected to the electrode of the electrostatic adsorption member a direct-current source connected to the other end of the first wiring;

second wiring having an end connected to the base table;

a high frequency source connected to the other end of the second wiring;

a third wiring for connecting the first wiring and the second wiring; and a first capacitor formed on the third wiring.

The present invention provides a plasma processing apparatus comprising:

a chamber for applying plasma processing to a substrate while holding airtight;

a lower electrode structure housed in the chamber and having a mounting surface for the substrate;

an upper electrode arranged in the chamber so as to face the mounting surface of the lower electrode structure;

an exhaust system for exhausting the chamber;

a process gas supply system for introducing a process gas into the chamber;

the lower electrode structure comprising a base table formed of a conductive material a dielectric layer formed on the base table and having a mounting surface for the substrate;

an electrostatic adsorption member formed within the dielectric layer and having an electrode electrically isolated from the base table;

first wiring having an end connected to the electrode of the electrostatic adsorption member;

a direct-current source connected to the other end of the first wiring;

second wiring having an end connected to the base table;

a high frequency source connected to the other end of the second wiring;

a third wiring for connecting the first wiring and the second wiring; and a first capacitor formed on the third wiring, wherein a plasma of the process gas is formed in the chamber by a high frequency power output from the high frequency source and applied to the substrate, thereby performing a predetermined plasma processing.

In the present invention, the high frequency source is connected to the base table by way of the second wiring and a high frequency voltage is applied to the base table; on the other hand, the high frequency source is connected to the first wiring which connects the electrode of the electrostatic adsorption member to the direct-current source, by way of the third wiring having a capacitor. Therefore, the high frequency voltage is superimposed on the direct-current voltage to be applied to the electrode of the electrostatic adsorption member. Since the high frequency voltage is applied not only to the base table but also the electrode of the electrostatic adsorption member as described, the high frequency can be effectively passed without being interrupted by the electrostatic adsorption member. As a result, the high frequency electric field can be converged on the substrate, thereby performing satisfactory plasma processing.

Furthermore, a high frequency voltage is applied by the third wiring to both of the electrostatic adsorption member and the base table. However, due to the presence of a capacitor in the third wiring, a direct-current voltage is not superimposed on the second wiring. Since the phase difference of the high frequency voltages to be applied to the electrode of the electrostatic adsorption member and the base table can be reduced to a minimum, an abnormal discharge within the substrate can be prevented.

The abnormal discharge presumably occurs in the lower electrode structure when the potential difference between members adjacent to each other exceeds a predetermined value. When a direct-current voltage is applied to the electrode of the electrostatic adsorption member and a high frequency voltage is applied to the base table, an extremely large potential difference is periodically produced between the electrode and the base table. As a result, an abnormal discharge occurs.

Under the circumstance, if the potential difference between the electrode of the electrostatic adsorption member and the base table is constantly set within a predetermined narrow range as described above, the abnormal discharge can be prevented even if a pipe for supplying a heat transmission gas such as helium gas, is formed within the base table.

It is preferable that the present invention further comprise a capacitor which is formed on the second wiring and interposed between the base table and a connecting point between the second wiring and the third wiring.

Since the capacitor is interposed, it is possible to control the phases of the high frequency powers to be applied to the electrode of the electrostatic adsorption member and the base table. If the phase difference is reduced to a minimum, the abnormal discharge can be prevented.

In this case, if the phase of the high frequency to be applied to the electrode of the electrostatic adsorption member is allowed to coincide with that to be applied to the base table, the abnormal discharge can be most efficiently prevented.

To describe more specifically, if the capacitor to be arranged to the second wiring has the same capacitance as that of the capacitor to be applied to the third wiring, the impedance from the connecting point between the second wiring and the third wiring to the flat electrode can be made equal to that from the connecting point to the base table. As a result, the phase of the high frequency to be applied to the electrode of the electrostatic adsorption member is allowed to coincide with that to be applied to the base table.

BRIEF DESCRIPTION OF DRAWINGS

FIG. 1 is a schematic view of a lower electrode structure according to an embodiment of the present invention.

FIG. 4 is a schematic view of a conventional lower electrode structure.

FIG. 5 is a schematic view of another conventional lower electrode structure.

BEST MODE FOR CARRYING OUT OF THE INVENTION

Figure 2:
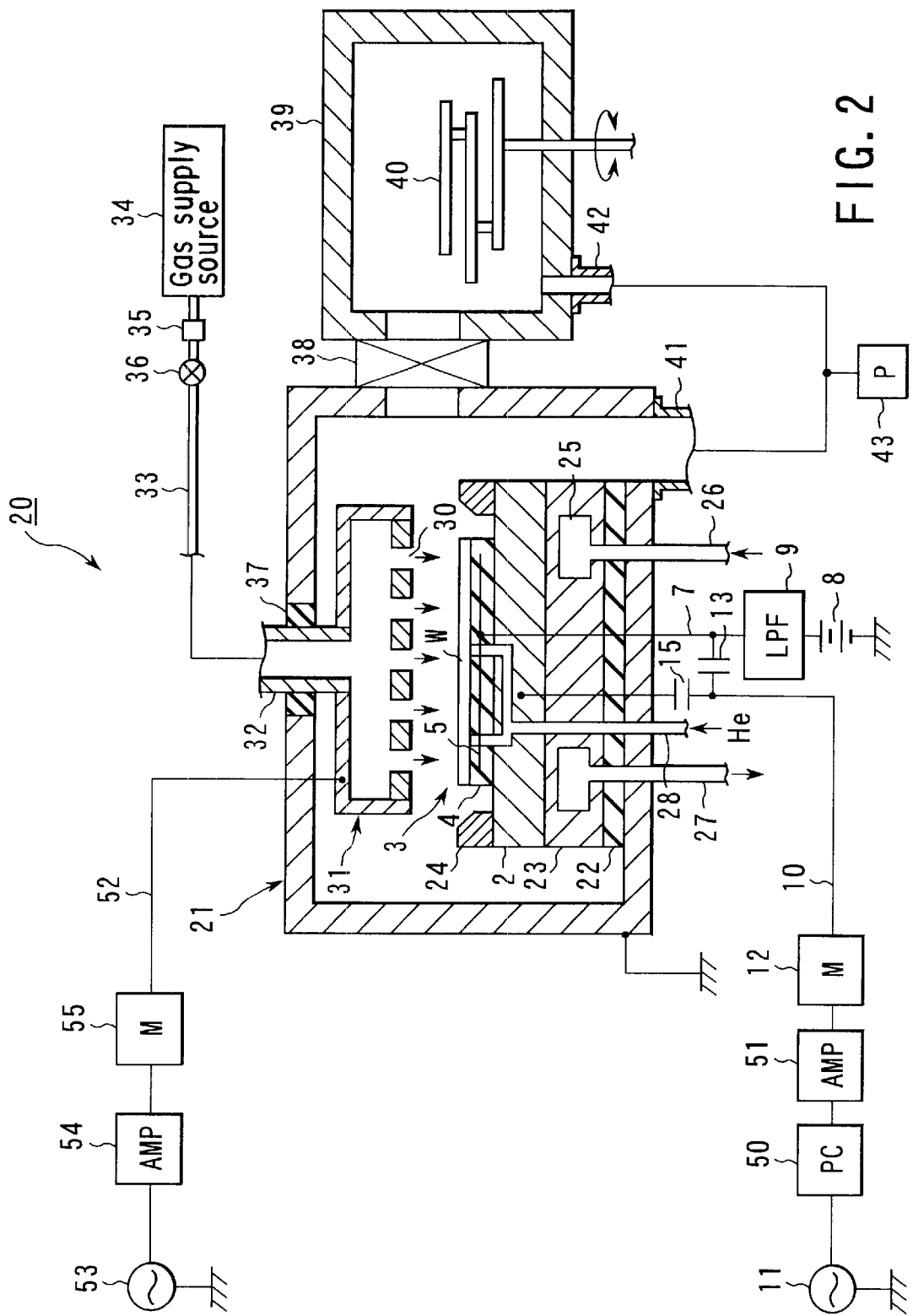
FIG. 2 is a schematic view of a plasma processing apparatus according to an embodiment of the present invention.

Now, embodiments of the present invention will be described more specifically.

FIG. 1 is a schematic view of a lower electrode structure according to an embodiment of the present invention.

A lower electrode structure 1 shown in FIG. 1 is arranged in an chamber of a plasma processing apparatus such as a plasma etching apparatus and serves as a plasma formation electrode.

The lower electrode structure 1 has a base table formed of a conductive material such as aluminium, namely, a susceptor 2. On the susceptor 2, formed is an electrostatic chuck 3 (electrostatic adsorption member) having a dielectric layer 4 and a flat electrode 5 arranged inside the dielectric layer.

As materials for forming the dielectric layer 4, there are ceramic and a resin. The dielectric layer 4 formed of ceramic is particularly effective in this embodiment.

A pipe 6 for supplying a heat-transmitting gas such as helium (He) is vertically formed through the susceptor 2 and the dielectric layer 4. The pipe 6 is branched within the dielectric layer 4 and connected to numerous holes (not shown) formed in the surface of the dielectric layer 4. With this structure, the heat-transmitting gas such as helium gas is sprayed out from the numerous holes to supply it to between the dielectric layer 4 and a substrate, such as a semiconductor substrate (hereinafter referred to as "wafer") chucked on the dielectric layer 4.

To the flat electrode 5, an end of wiring 7 is connected. The other end of the wiring 7 is connected to a direct-current source 8. The wiring 7 between the flat electrode 3 and the direct-current source 8 is equipped with a low-pass filter 9. The low-pass filter 9 is constituted of a capacitor 16 and a resistance 17.

On the other hand, the wiring 10 is connected to the susceptor 2 at one end via a capacitor 15 (described later). The other end of the wiring 10 is connected to a high frequency source 11. The wiring 10 between the capacitor 15 and the high frequency source 11 is provided with a matching box 12.

The wiring 7 and the wiring 10 are connected with a wiring element 14 having a capacitor 13. Therefore, a high frequency voltage from the high frequency source 11 is superimposed on the direct-current voltage to be applied to the flat electrode 3 from the direct-current source 8. More specifically, the high frequency voltage is applied to both the susceptor 2 and the flat electrode 3, whereas the direct-current voltage is not superimposed on the wiring 10 by the presence of the capacitor 13.

In the conventional structure (FIG. 4) employing the dielectric layer 103 formed of ceramic, when a high frequency of 2 MHz or less is applied only to the susceptor 101, formation of a high frequency electric field immediately upon the wafer W is significantly prevented by the dielectric layer 103, as mentioned above. However, when a high frequency voltage is applied to the flat electrode 5 as is in this embodiment, the formation of the high frequency electric field is prevented only in the region of the dielectric layer 4 between the flat electrode 5 and the wafer 6. In contrast, the formation of the high frequency electric field is not affected in the region of the dielectric layer 4 between the flat electrode 5 and the susceptor 2.

Accordingly, when the high frequency voltage is applied to the flat electrode 5, the effect of the dielectric layer 4 can be reduced compared to the case where the high frequency voltage is applied only to the susceptor 2. In other words, even in the case where the frequency of the high frequency power supplied from the high frequency source 11 is 2 MHz or less and the dielectric layer is formed of ceramic, it is possible to converge the high frequency electric field on the wafer W. As a result, a satisfactory high frequency electric field can be formed.

Furthermore, in a conventional case where a high frequency voltage is applied to either the susceptor 2 or the flat electrode 5, the potential difference between the susceptor 2 and the flat electrode 3 periodically varies. Therefore, if the maximum vale of the potential difference exceeds the threshold, an abnormal discharge occurs in a pipe 6.

In contrast, in the aforementioned case, high frequency voltages having the same frequency are applied to both the susceptor 2 and the flat electrode 3. Furthermore, the structure is designed such that a direct-current voltage is not superimposed on the side of the high frequency source by the presence of the capacitor 13. Therefore, the phase difference of the high frequency voltage can be sufficiently reduced. According to the arrangement of the structure, it is possible to reduce the maximum value of the potential difference compared to the case where a high frequency voltage is applied either one of the susceptor 2 and the flat electrode 5. Hence, the occurrence of an abnormal discharge can be prevented.

The phase difference between the high frequency voltages to be applied to the susceptor 2 and that to be applied to the flat electrode is not always to be zero. However, when the phase difference is rendered zero, the maximum value of the potential difference can be further reduced, with the result that the potential difference between the susceptor 2 and the flat electrode 5 can be always maintained at an extremely low level. It is therefore possible to prevent occurrence of an abnormal discharge more efficiently.

To allow the phase of the high frequency voltage to be applied to the susceptor 2 to coincide with that to be applied to the flat electrode 3, the impedance from the connecting point of the wiring 10 to the susceptor 2 and the wiring 14 may be allowed to coincide with that from the connecting point to the flat electrode 3.

For example, the impedances mentioned above may be allowed to coincide with each other by interposing a capacitor 15, which has the same capacitance as that of the capacitor 13, between the susceptor 2 and the connecting point of the wiring 10 and the wiring 14. In this manner, the phase difference between the high frequency voltage to be applied to the susceptor 2 and that to be applied to the flat electrode 3 can be rendered zero.

According to the lower electrode structure 1 of this embodiment, a satisfactory high frequency electric field can be formed without occurrence of an abnormal discharge even if the frequency of the high frequency power supplied from the high frequency source 11 is 2 MHz or less.

For example, when the frequency of the high frequency power supplied form the high frequency source 11 is 800 kHz, if the capacitance of a capacitor 16 constituting a filter 9 is set at 100 pF to 1000 pF, the resistivity of a resistance 17 is $1.5 \times 10^6 \Omega$ to $3 \times 10^6 \Omega$, and each of capacitances of capacitors 13 and 15 is set at 10000 pF, the phase difference between the high frequency voltage to be applied to the susceptor 2 and that to be applied to the flat electrode 3 can be rendered zero. As a result, a satisfactory high frequency electric field can be formed on the wafer W. If the invention of this embodiment is applied to plasma processing, satisfactory plasma characteristics can be obtained.

Now, a plasma processing apparatus using the lower electrode structure 1 mentioned above will be explained.

FIG. 2 is a schematic view of a plasma processing apparatus according to an embodiment of the present invention. Note that this embodiment shows a plasma etching apparatus in which the lower electrode structure 1 is employed.

In FIG. 2, a plasma etching apparatus 20 has an air-tight chamber 21. An insulating support board 22 is arranged at the bottom of the chamber 21. A cooling member 23 and a susceptor 2 are stacked on the support board 22 in this order. An electrostatic chuck 3 formed on the upper surface of the susceptor 2. The electrostatic chuck 3 is constituted of a dielectric layer 4 and a flat electrode 5 buried in the dielectric layer 4. A wafer W is mounted on the dielectric layer 4.

A focus ring 24 is arranged on the dielectric layer 4 to surround the wafer W.

The cooling member 23 has a refrigerant circulating passage 25 formed therein. A refrigerant is supplied to the refrigerant circulating passage 25 from outside the chamber 21 via a flow passage 26. The refrigerant supplied to the refrigerant circulating passage 25 is used for cooling the wafer etc., and discharged from the chamber 21 to the outside by way of a flow passage 27.

Furthermore, a pipe 28 is formed through the support board 22, cooling member 23, the susceptor 2 and the dielectric layer 4, for supplying helium gas between the dielectric layer 4 and the wafer W.

In an upper portion of the chamber 21, a shower head 31 is arranged. The shower head has numerous holes 30 on the surface facing the dielectric layer 4. To the shower head 31, a gas supply source 34 is connected by way of pipes 32 and 33. The gas supply source 34 contains a process gas such as $CF_4$, which is supplied to the chamber 21 by way of the pipe 33 and the shower head 31. The pipe 33 is provided with a mass-flow controller 35 and a valve 36 in the order from the side of a gas supply source 34. Incidentally, the shower head 31 is formed of a conductive material and serves as an upper electrode.

The pipe 32 for supplying the process gas to the shower head 31 is electrically isolated from and the chamber 21 by an insulating member 37.

A load-lock chamber 39 is arranged at a side of the chamber 21 with a gate valve 38 interposed between them. The load-lock chamber 39 houses a transfer mechanism 40 which is formed a plurality of arms in combination. The transfer mechanism 40 is used for transferring a wafer W between the load-lock chamber 39 and the chamber 21.

The chamber 21 and the load-lock chamber 39 have discharge ports 41 and 42, respectively. The chamber 21 and the load-lock chamber 39 are vacuumed by a pump 43 through the discharge ports 41 and 42, respectively. As a result, desirable vacuum conditions are created within the chamber 21 and the load-lock chamber 39.

An end of wiring 7 is connected to the flat electrode 5. The other end of the wiring is connected to a direct-current source 8. The wiring 7 between the flat electrode 3 and the direct-current source 8 is provided with a low-pass filter 9. On the other hand, one end of the wiring 10 is connected to the susceptor 2 and the other end of the wiring 10 is connected to a high frequency source 11.

Furthermore, the wiring 10 between the susceptor 2 and the high frequency source 11 is provided with a phase shift circuit 50, an amplifier 51, a matching box 12 and a capacitor 15 sequentially in this order form the side of the high frequency source 11.

The wiring 7 is connected to the wiring 14 at a position between the low-pass filter 9 and the flat electrode 3. The other end of the wiring 14 is connected to the wiring 10 at a position between the matching box 12 and the capacitor 15.

Therefore, a high frequency voltage from the high frequency source 11 is superimposed on the direct-current voltage to be applied from the direct current source 8 to the flat electrode 3. More specifically, the high frequency voltage is applied to both of the susceptor 2 and the flat electrode 3. Note that the wiring 14 has a capacitor 13 between the connecting point to the wiring 7 and that to the wiring 10. Therefore, the direct-current voltage is not superimposed on that of the wiring 10.

A wiring 52 is connected to the shower head 31 at one end. The other end of the wiring 52 is connected to the high frequency source 53. An amplifier 54 and a matching box 55 are successively arranged between the shower head 31 and the high frequency source 53 in the order from the side of the high frequency source 53.

The phase of the high frequency to be applied from the high frequency source 11 to the susceptor 2 by the phase shift circuit 50 is shifted by an angle of 180° with respect to the phase of the high frequency to be applied from the high frequency source 53 to the shower head 31.

In the plasma etching apparatus 20 thus arranged, the wafer W is first transferred from the load-lock chamber 39 to the chamber 21 by the transfer mechanism 40 and further placed on the dielectric layer 4. Note that the load-lock chamber 39 and the chamber 21 have been evacuated by a pump 45 to a predetermined pressure.

Subsequently, a high frequency power having a frequency of 2 MHz or less, for example, 800 kHz, is supplied from the high frequency source 11 to the susceptor 2. On the other hand, a high frequency power of 13.56 MHz is supplied from the high frequency source 53 to the shower head 31. In this case, if the capacitance of the capacitor 16 constituting the low-pass filter 9 is set at 100 pF to 1000 pF, the resistivity of the resistor 17 at $1.5 \times 10^6 \Omega$ to $3 \times 10^6$, and each of the capacitances of the capacitors 13, 15 is set at 10000 pF, the phase difference between the high frequency voltage to be applied to the susceptor 2 and that to be applied to the flat electrode 3 can be controlled to be zero, at the same time, a satisfactory high frequency electric field can be formed.

Furthermore, the valve 36 is opened under the aforementioned conditions, thereby supplying a process gas from the gas supply source 34 to the shower head 31 while controlling the flow rate by a mass-flow controller 35. The process gas is converted into a plasma state by the high frequency electric field between the shower head 31 and the susceptor 2. More specifically, a plasma is formed between the shower head 31 and the wafer W and used for etching the surface of the wafer W. The etching is performed while supplying helium gas (He) between the dielectric layer 4 and the wafer W by way of the pipe 28 and supplying a refrigerant from the flow passage 26 to a refrigerant circulating passage 25, whereby the temperature of the wafer W can be controlled. In this manner, the etching rate can be accurately controlled.

Subsequently, another plasma processing apparatus using the lower electrode structure 1 shown in FIG. 1 will be explained.

Figure 3:
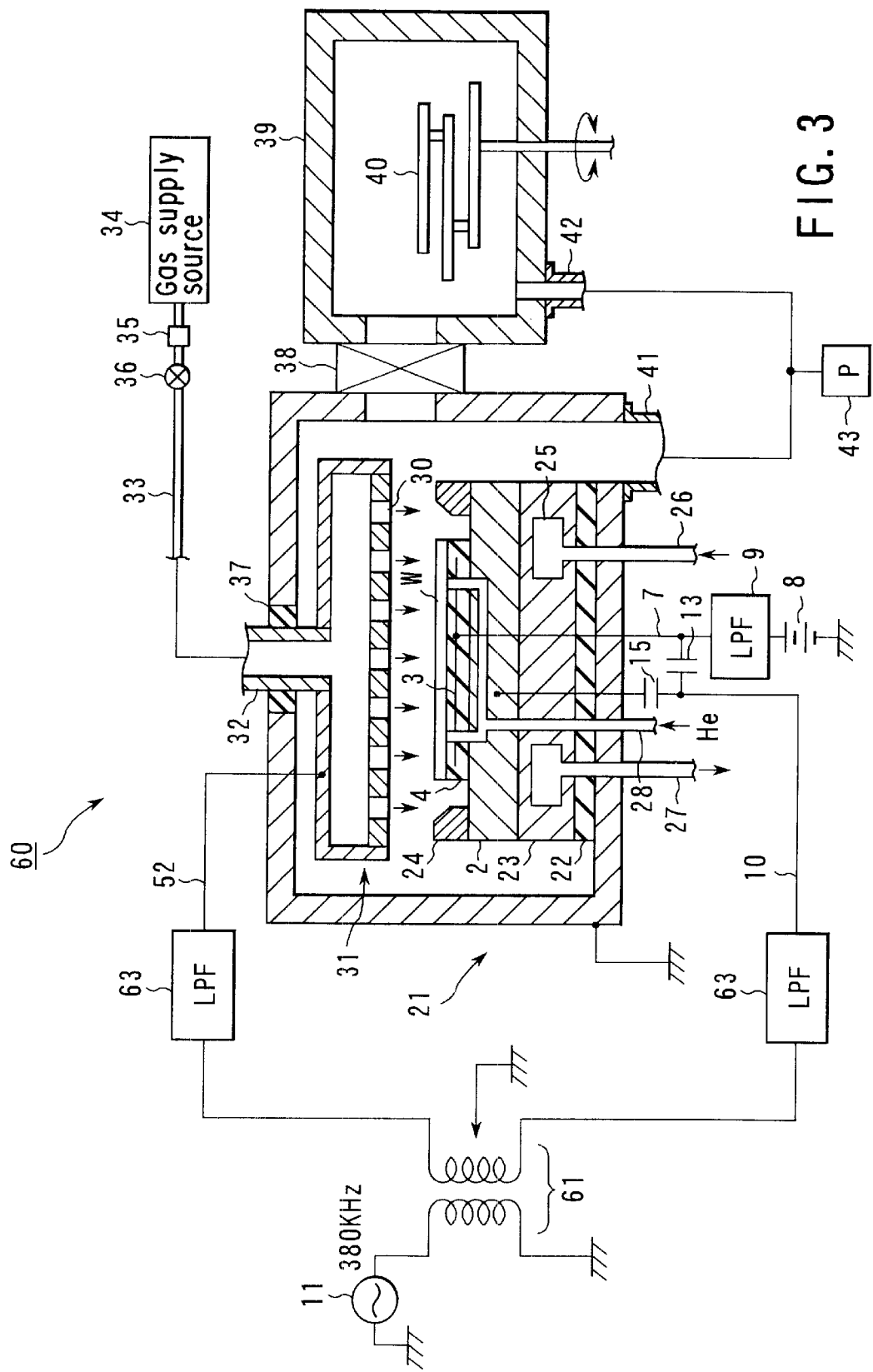
FIG. 3 is a schematic view of another plasma processing apparatus according to an embodiment of the present invention.

FIG. 3 is a schematic view of another plasma etching apparatus according to the embodiment of the present invention. Note that FIG. 3 shows a plasma etching apparatus employing the present invention, in the same as in FIG. 2. In FIG. 3, like reference numerals are used to designate like structural elements corresponding to those like in FIG. 2 and any further explanation is omitted.

In the plasma etching apparatus 60 shown in FIG. 3, power is supplied in a different manner from in the plasma etching apparatus 20 shown in FIG. 2. More specifically, in the plasma etching apparatus 60 shown in FIG. 3, a high frequency power is supplied from the same high frequency source 11 to both of the susceptor 2 and the shower head 31.

The high frequency power supplied from the high frequency source 11 is divided by a variable trance 61 into the wiring 10 and the wiring 52. The high frequency power distributed to the wiring 10 passes through a low-pass filter 63 and then applied to the susceptor 2 and the flat electrode 3 in the same manner explained in FIG. 2. On the other hand, the high frequency voltage distributed to the wiring 52 passes through a low-pass filter 63 and then applied to the shower head 31.

Etching using the plasma etching apparatus 60 is performed in accordance with, for example, the method shown below.

To be more specific, the wafer W is transferred by the transfer mechanism 40 from the lord-lock chamber 39 into the chamber 21 and further mounted on the dielectric layer 4. Note that the load-lock chamber 39 and the chamber 21 have been evacuated by the pump 45 to a predetermined pressure.

Subsequently, a high frequency power having a frequency of 2 MHz or less, for example, 380 kHz, is supplied from the high frequency source 11 to the susceptor 2 and the shower head 31. In this case, the ratio of the power to be distributed to the wiring 52 to that to be distributed to the wiring 10 is for example, 6:4. Furthermore, if the capacitance of the capacitor 16 constituting the filter 9 is set at 100 pF to 1000 pF, the resistivity of the resistor 17 at $1.5 \times 10^6 \Omega$ to $3 \times 10^6 \Omega$, and each of the capacitances of the capacitors 13, 15 is set at 10000 pF, the phase difference between the high frequency voltage to be applied to the susceptor 2 and that to be applied to the flat electrode 3 can be controlled to be zero and a satisfactory high frequency electric field can be formed.

Also in the plasma etching apparatus thus constituted, a reaction gas is supplied from the gas supply source 34 to the shower head 31 by opening the valve 36 while controlling the flow rate by the mass-flow controller 35 and supplying the high frequency as mentioned above. In this way, a plasma is formed between the shower head 31 and the susceptor 2 where a high frequency electric field is formed. As a result, the surface of the wafer W is etched.

Etching is performed while helium gas is supplied between the dielectric layer 4 and the wafer W by way of the pipe 28 and a refrigerant is supplied from the flow passage 26 to the refrigerant circulating passage 25. It is therefore possible to control the temperature of the wafer W and thereby the etching rate is controlled with a high accuracy.

According to the plasma etching apparatus 60 shown in FIG. 3, a high frequency voltage is applied from a single high frequency source to both of the susceptor 2 and the shower head 31, so that the structure of the system can be simplified.

Note that the present invention is not limited to the embodiments and can be modified in various ways.

In the embodiments mentioned above, we explained the case where the present invention is applied to a plasma etching apparatus. The present invention is not limited to these and applicable to other plasma processing apparatuses including a plasma CVD.

INDUSTRIAL APPLICABILITY

When the lower electrode structure of the present invention is applied to a plasma processing apparatus, a high frequency voltage is applied to both of the base table and the flat electrode of the lower electric structure. Therefore, a high frequency electric field can be more preferably formed compared to a conventional case where a high frequency voltage is applied only to the base table.

According to the present invention, since a high frequency voltage is applied to both of the base table and the flat electrode of the lower electrode structure, the phase difference between the high frequency voltages to be applied to the base table and the flat electrode can be sufficiently reduced. Therefore, the potential difference between the base table and the flat electrode can be maintained always low, with the result that an abnormal discharge occurring when the potential difference between them exceeds a permissible value.

According to the present invention, there is provided a lower electrode structure capable of forming a good high frequency electric field without causing an abnormal discharge while preventing the temperature of a substrate to be processed from excessively increasing, and also provided a plasma processing apparatus.

What is claimed is:

1. A lower electrode structure for use in an apparatus in which plasma processing is applied to an substrate, comprising:

a base table formed of a material having a conductivity;

an electrostatic adsorption member formed on the base table and having a dielectric layer on which the substrate to be mounted and within which an electrode electrically isolated from the base table is housed;

first wiring having an end connected to an electrode of the electrostatic adsorption member;

a direct current source connected to the other end of the first wiring;

a second wiring having an end connected to the base table;

a high frequency source connected to the other end of the second wiring;

a third wiring for connecting the first wiring to the second wiring;

a first capacitor formed on the third wiring; and a second capacitor formed on the second wiring and interposed between the substrate and a connecting point between the second wiring and the third wiring, wherein said second capacitor formed on the second wiring and the first capacitor formed on the third wiring have the same capacitance.

2. The lower electrode structure according to claim 1, wherein the dielectric layer of the electrostatic adsorption material is formed of ceramic.

3. The lower electrode structure according to claim 1, comprising a gas supply means for supplying a heat-transmitting gas between the dielectric layer and the substrate from a lower portion of the base table via the electrostatic adsorption member.

4. The lower electrode structure according to claim 1, further comprising a low-pass filter on the first wiring between the direct current source and the first capacitor.

5. A plasma processing apparatus comprising:

a chamber for applying plasma processing to a substrate while holding airtight;

a lower electrode structure housed in the chamber and having a mounting surface for the substrate;

an upper electrode arranged in the chamber so as to face the mounting surface of the lower electrode structure;

an evacuation system for evacuating the chamber;

a process gas supply system for introducing a process gas into the chamber;

said lower electrode structure comprising a base table formed of a conductive material a dielectric layer formed on the base table and having a mounting surface for the substrate;

an electrostatic adsorption member formed within the dielectric layer and having an electrode electrically isolated from the base table;

first wiring having an end connected to the electrode of the electrostatic adsorption member;

a direct-current source connected to the other end of the first wiring;

second wiring having an end connected to the base table;

a high frequency source connected to the other end of the second wiring;

a third wiring for connecting the first wiring and the second wiring;

a first capacitor formed on the third wiring;

a second capacitor formed on the second wiring and interposed between the base table and a connection point between the second wiring and the third wiring;

wherein said second capacitor formed on the second wiring and the first capacitor formed on the third wiring have the same capacitance.

6. The plasma processing apparatus according to claim 5, wherein the dielectric layer of the electrostatic adsorption member is formed of ceramic.

7. The plasma processing apparatus according to claim 5, comprising a gas supply means for supplying a heat-transmitting gas between the dielectric layer and the substrate from a lower portion of the base table via the electrostatic adsorption member.

8. The plasma processing apparatus according to claim 5, further comprising a low-pass filter on the first wiring between the direct current source and the first capacitor.

9. The plasma processing apparatus according to claim 5, further comprising a high frequency source for supplying a high frequency source to the opposite electrode.

* * * * *